US010398021B2

(12) United States Patent
Avalos et al.

(10) Patent No.: US 10,398,021 B2
(45) Date of Patent: Aug. 27, 2019

(54) HOUSING FOR AN ELECTRONIC CONTROL UNIT AND METHOD OF MANUFACTURE

(71) Applicant: Robert Bosch GmbH, Stuttgart (DE)

(72) Inventors: Hiram Avalos, Detroit, MI (US); Jeff Reuter, Farmington, MI (US); Mark Ryskamp, Grosse Pointe Park, MI (US); Motozo Horikawa, Plymouth, MI (US)

(73) Assignees: Robert Bosch LLC, Broadview, IL (US); Robert Bosch GmbH, Stuttgart (DE)

( * ) Notice: Subject to any disclaimer, the term of this patent is extended or adjusted under 35 U.S.C. 154(b) by 0 days.

(21) Appl. No.: 15/666,035

(22) Filed: Aug. 1, 2017

(65) Prior Publication Data

US 2018/0042101 A1 Feb. 8, 2018

Related U.S. Application Data

(60) Provisional application No. 62/371,425, filed on Aug. 5, 2016.

(51) Int. Cl.
  *H05K 1/02* (2006.01)
  *H05K 7/20* (2006.01)
  *H05K 5/00* (2006.01)
  *B29C 45/00* (2006.01)
  *B29L 31/34* (2006.01)

(52) U.S. Cl.
  CPC ....... *H05K 1/0206* (2013.01); *B29C 45/0046* (2013.01); *H05K 5/0017* (2013.01); *H05K 7/20418* (2013.01); *H05K 7/20854* (2013.01); *B29K 2995/0012* (2013.01); *B29K 2995/0013* (2013.01); *B29K 2995/0044* (2013.01); *B29L 2031/3481* (2013.01)

(58) Field of Classification Search
  CPC .............. B29C 45/0046; H05K 1/0206; H05K 7/20854; H05K 7/20418; H05K 5/0017; B29K 2995/0013; B29K 2995/0012; B29K 2995/0044; B29L 2031/3481
  USPC ........................................................ 361/720
  See application file for complete search history.

(56) References Cited

U.S. PATENT DOCUMENTS 4,409,641 A * 10/1983 Jakob ................. H05K 7/20854
                                                 361/720
5,243,131 A *  9/1993 Jakob ................. H05K 7/20854
                                                 174/536

(Continued)

*Primary Examiner* — Anatoly Vortman
(74) *Attorney, Agent, or Firm* — Kelly McGlashen; Maginot Moore & Beck LLP

(57) ABSTRACT

A housing assembly for an electronic circuit including an electronic control unit (ECU) is a low-profile, generally rectangular device that includes a base, a cover that closes an open end of the base, and a printed circuit board (PCB). The housing assembly securely supports the PCB and its associated electronic components while providing improved cooling properties and lower manufacturing costs. This is achieved by providing passive cooling features on an outer surface of the cover, and by employing a thermally conductive plastic to form the passive cooling features, where the cover has predetermined and defined anisotropic thermal conduction properties configured to optimize thermal conduction and cooling of the ECU.

17 Claims, 7 Drawing Sheets

(56) References Cited

U.S. PATENT DOCUMENTS

| | | | | |
|---|---|---|---|---|
| 5,272,593 A * | 12/1993 | Jakob | H05K 7/20854 | 257/713 |
| 5,373,104 A * | 12/1994 | Brauer | H05K 5/0013 | 174/562 |
| 5,461,542 A * | 10/1995 | Kosak | B60R 16/0239 | 165/185 |
| 5,548,481 A * | 8/1996 | Salisbury | B60R 16/0238 | 174/16.3 |
| 5,777,844 A * | 7/1998 | Kiefer | H05K 7/20854 | 165/80.3 |
| 5,808,868 A * | 9/1998 | Drekmeier | H01L 23/16 | 165/80.2 |
| 6,049,469 A * | 4/2000 | Hood, III | G06F 1/182 | 174/388 |
| 6,084,776 A * | 7/2000 | Cuntz | H05K 1/0206 | 361/707 |
| 6,222,732 B1 * | 4/2001 | Jakob | H05K 1/0209 | 174/252 |
| 6,434,000 B1 * | 8/2002 | Pandolfi | F25B 21/02 | 136/204 |
| 7,023,699 B2 * | 4/2006 | Glovatsky | H05K 7/20454 | 165/185 |
| 7,050,305 B2 * | 5/2006 | Thorum | H05K 5/0013 | 165/185 |
| 7,336,491 B2 * | 2/2008 | Goemmel | H05K 7/20436 | 165/67 |
| 7,440,282 B2 * | 10/2008 | Brandenburg | H01L 23/3675 | 165/185 |
| 8,050,037 B2 * | 11/2011 | Tsuyuno | H05K 1/141 | 165/104.33 |
| 8,537,553 B2 * | 9/2013 | Mohammed | H01L 23/373 | 174/252 |
| 8,797,742 B2 * | 8/2014 | Kawai | H05K 7/20854 | 361/704 |
| 8,929,078 B2 * | 1/2015 | Weeber | H01L 23/552 | 165/80.3 |
| 8,998,458 B2 * | 4/2015 | Tankala | F21K 9/90 | 362/373 |
| 9,277,681 B2 * | 3/2016 | Kawai | H05K 7/20854 | |
| 9,392,317 B2 * | 7/2016 | Bose | H04N 21/418 | |
| 9,555,828 B2 * | 1/2017 | Tashima | B62D 5/0406 | |
| 9,568,259 B2 * | 2/2017 | Mayer | F28F 21/00 | |
| 10,027,051 B1 * | 7/2018 | Manushi | H01R 13/504 | |
| 2007/0053168 A1 * | 3/2007 | Sayir | B32B 18/00 | 361/718 |
| 2007/0230137 A1 * | 10/2007 | Inagaki | B60R 16/0239 | 361/719 |
| 2008/0017174 A1 * | 1/2008 | Kafer | B60T 8/3675 | 123/479 |
| 2008/0291646 A1 * | 11/2008 | Fino | H05K 7/20445 | 361/752 |
| 2010/0254093 A1 * | 10/2010 | Oota | B60R 16/0239 | 361/720 |
| 2015/0216088 A1 * | 7/2015 | Kawai | H05K 1/0203 | 361/710 |
| 2018/0049349 A1 * | 2/2018 | Voss | H05K 7/20436 | |

* cited by examiner

HOUSING FOR AN ELECTRONIC CONTROL UNIT AND METHOD OF MANUFACTURE

BACKGROUND

An electronic control unit (ECU) housing is used to support and protect an electronic circuit including the ECU. For example, the electronic control unit (ECU) may be used to control the electronics of an internal combustion engine of a vehicle. The housing may include a tray-like base, a cover that overlies and closes the base, and a printed circuit board (PCB) is supported between the base and the cover. The electronic control unit and/or other electronic components are mounted on the PCB. The PCB may also include one or more connection plugs configured to receive an electrical harness that connects the ECU to the vehicle engine. The ECU and other electronics provided on the PCB and enclosed between the cover and the base generate heat that can negatively affect performance of the ECU if not sufficiently dissipated. For this reason, the housing may include passive cooling features. Although ECU housings having passive cooling features are known, it is desireable to provide such housings at a lower cost and having improved cooling capabilities.

SUMMARY

In some aspects, a housing assembly is provided for an electronic control unit. The housing assembly includes a frame portion that is configured to support a printed circuit board and is formed of a first material; a heat sink portion that is supported on the frame portion and is formed of a second material; and the printed circuit board. The printed circuit board includes a first side that abuts the heat sink portion and a second side that is opposed to the first side. The first material is different than the second material, and the second material is a thermally conductive plastic.

The housing assembly may include one or more of the following features: The second material is thermally anisotropic and is configured to provide greater thermal conductivity in predetermined directions than in other directions. The heat sink portion includes a planar region defining a plane and having cooling ribs that protrude outwardly from one side of the planar region. In addition, the second material is thermally anisotropic and is configured to provide within the planar region, a higher thermal conductivity in a direction parallel to the plane than in a direction perpendicular to the plane, and within the cooling ribs, a higher thermal conductivity in a direction perpendicular to the plane than in a direction parallel to the plane. The first material is a plastic material having a greater strength than the second material. The heat sink portion is surrounded by the frame portion. The heat sink portion includes an outward-facing side, an inward-facing side that is opposed to the outward facing side and abuts the printed circuit board, and cooling ribs that protrude outwardly from the outward-facing side. The heat sink portion includes a domed region that protrudes outwardly from the outward-facing side, and the cooling ribs are disposed between the domed region and the peripheral edge. The printed circuit board supports electronic components on the first side, and the domed region overlies the electronic components. A slot is formed along a circumference of a peripheral edge of the heat sink portion, and a portion of the frame portion is received within the slot. The printed circuit board includes electronic components supported on the second side and thermally conductive vias that extend between the first side and the second side. The frame portion includes a peripheral edge, and a through opening that is surrounded by the peripheral edge, the through opening shaped and dimensioned to receive and support the heat sink portion therein. An outward-facing surface of the frame portion includes outwardly protruding stiffening ribs. Each stiffening rib is includes one end that is disposed at a portion of the peripheral edge and an opposed end that is spaced apart from the portion of the peripheral edge, and each stiffening rib is oriented so as to extend in a direction perpendicular to the portion of the peripheral edge.

In some aspects, a method of optimizing the thermal conduction properties of a component made of a thermally conductive plastic material includes providing a molding tool and injection configuration for an injecting molding process in which the molding tool and injectors are arranged such that, during manufacture of the component, injected material flows in a direction corresponding to a direction of desired thermal conduction. The method also includes performing injection molding using the tool and the injection configuration to manufacture the component having anisotropic thermal conduction properties that provide greater thermal conductivity in the direction of desired thermal conduction relative to other directions.

The method may include one or more of the following additional steps and/or features: The step of providing a molding tool and injection configuration for the molding tool includes determining optimal flow directions by performing a thermal finite element analysis of a design of the component. The component comprises a housing assembly for an electronic control unit, the housing assembly including: a frame portion that is configured to support a printed circuit board and is formed of an injection molded first plastic material; and a heat sink portion that is supported on the frame portion and is formed of an injection molded second plastic material. The second plastic material is the thermally conductive plastic having anisotropic thermal conduction properties. The frame portion is injected in place with the heat sink portion. The component comprises a housing assembly for an electronic control unit, the housing assembly including a planar region defining a plane and having cooling ribs that protrude outwardly from one side of the planar region. In addition, the anisotropic thermal conduction properties include within the planar region, a higher thermal conductivity in a direction parallel to the plane than in a direction perpendicular to the plane, and within the cooling ribs, a higher thermal conductivity in a direction perpendicular to the plane than in a direction parallel to the plane.

A housing assembly for an ECU is disclosed that includes a tray-like base, a cover that overlies the base, and a PCB that is sandwiched between the cover and the base. The cover is a two-piece component that includes a frame portion that is configured to support the PCB and is formed of a first material, and a heat sink portion that is supported on the frame portion and is formed of a second material. The first material used to form the frame portion is different than the second material that is used to form the heat sink portion. In particular, the first material is a plastic material having a greater strength than the second material, and the second material is a thermally conductive plastic material. The thermally conductive plastic material is anisotropic and is configured to provide greater thermal conductivity in predetermined directions than in other directions. For example, in one embodiment, the heat sink portion includes a planar region defining a plane and having cooling ribs that protrude outwardly from one side of the planar region. In this embodiment, the heat sink portion is configured to provide, within the planar region, a higher thermal conductivity in a direction parallel to the plane than in a direction perpendicular to the plane, and within the cooling ribs, a higher thermal conductivity in a direction perpendicular to the plane than in a direction parallel to the plane.

In some embodiments, the heat sink portion of the cover, which is formed of the thermally conductive plastic material, is manufactured in such a way as to provide improved thermal conduction in predetermined directions within the component. In some embodiments, the predetermined directions are set such that the cooling function of heat sink portion is optimized.

The housing assembly disclosed herein is advantageously formed of injection-molded plastics. Thus, the housing assembly disclosed herein is much more cost effective to manufacture than some conventional ECU housings in which the cover is formed of diecast aluminum. In addition to reducing material costs, use of plastic provides cost reductions since the tooling used to form the disclosed housing has a much greater lifespan than that used to form the conventional ECU housing. For example, a single injection molding tool may be able to provide approximately a million injection shots, whereas the tool used to diecast the aluminum cover may typically be able to provide approximately a hundred thousand castings.

Further advantages of using plastics to form the housing assembly are decreased weight relative to the weight of some conventional ECU housings in which the cover is formed of diecast aluminum.

In some embodiments, the thermally conductive plastic is black in color, which further improves ist radiation properies when compared to some conventional ECU housings in which the cover is formed of diecast aluminum and thus has a silver color.

DETAILED DESCRIPTION

Figure 1:
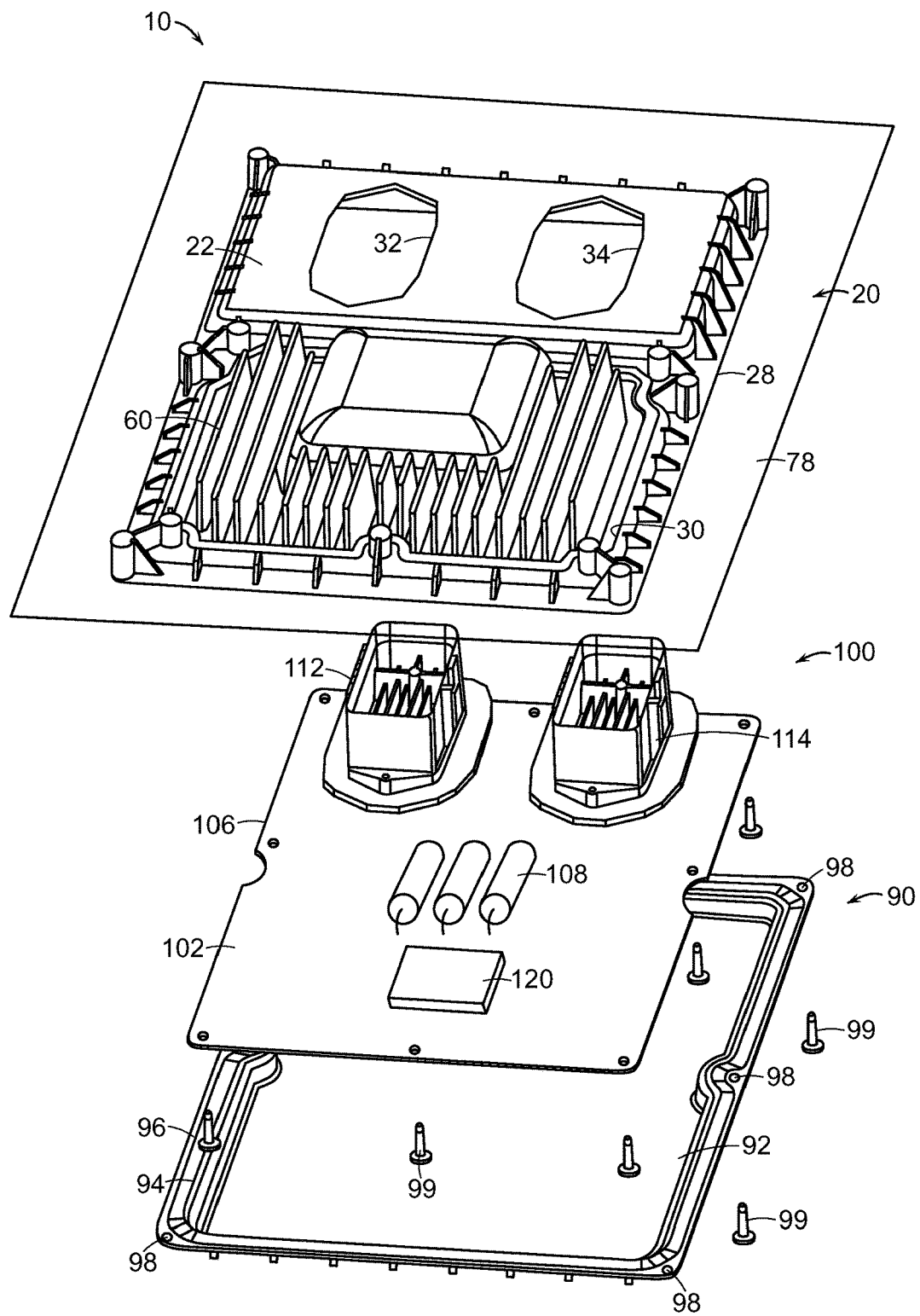
FIG. 1 is an exploded perspective view of a housing assembly including a cover, a PCB and a base.
Figure 3:
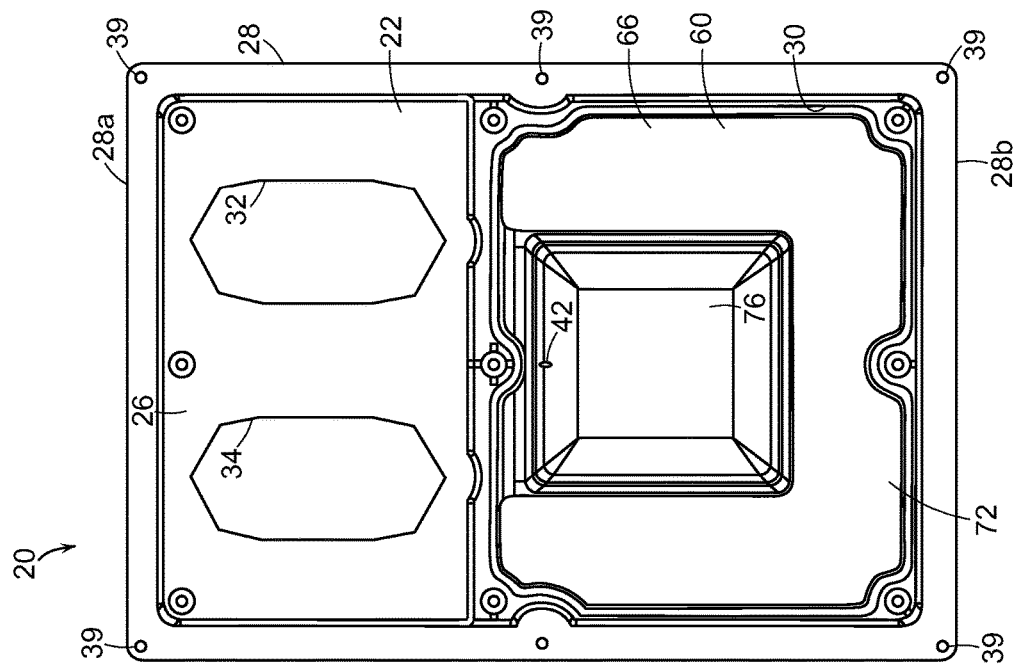
FIG. 3 is a bottom plan view of the cover of the housing assembly.
Figure 2:
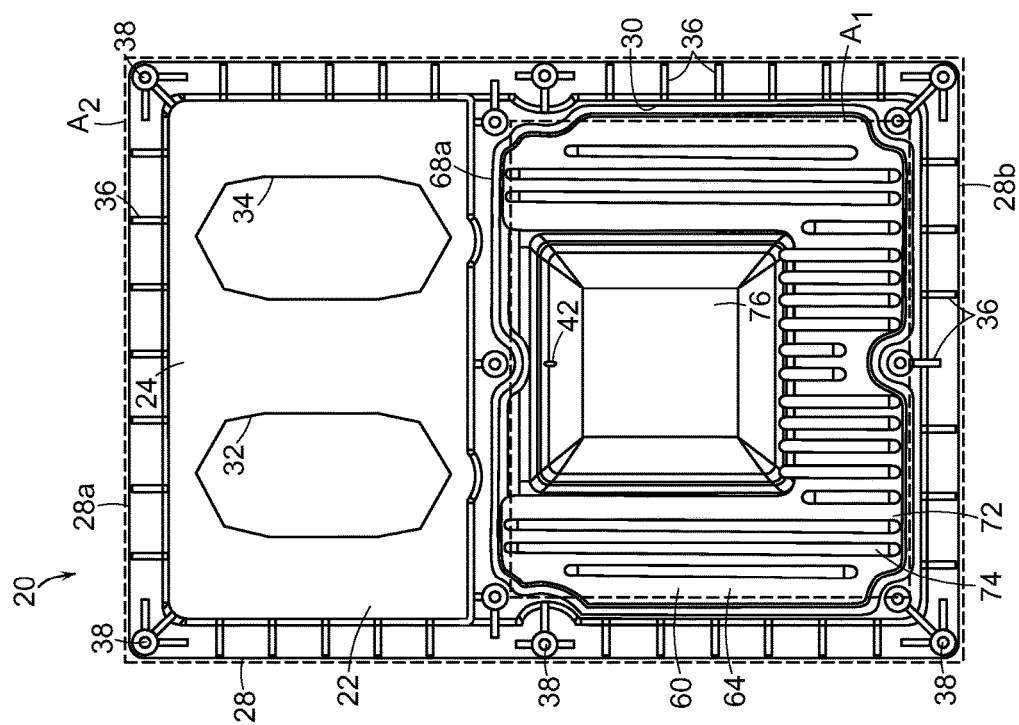
FIG. 2 is a top plan view of the cover of the housing assembly.
Figure 4:
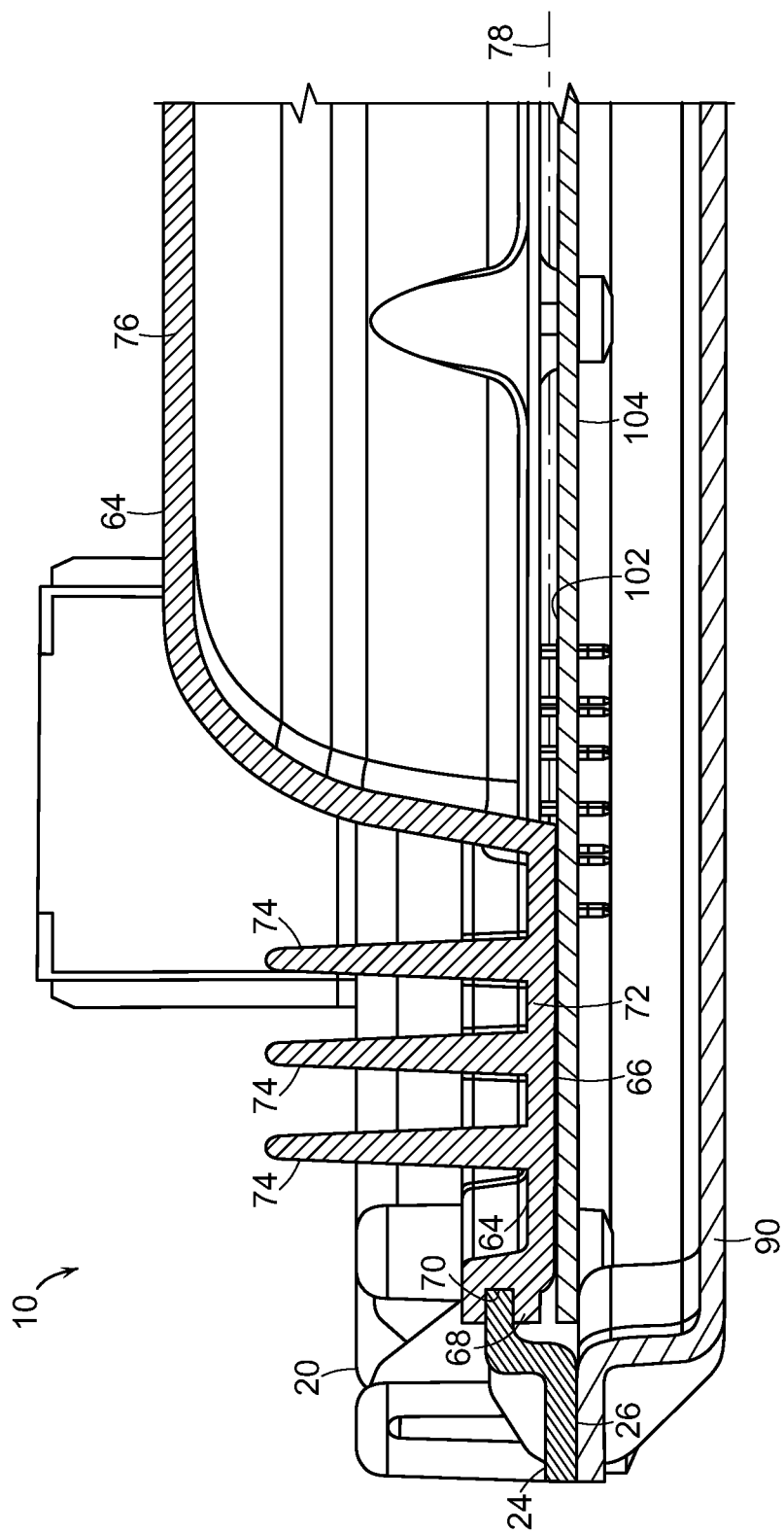
FIG. 4 is a cross sectional view of a portion of the housing assembly.
Figure 5:
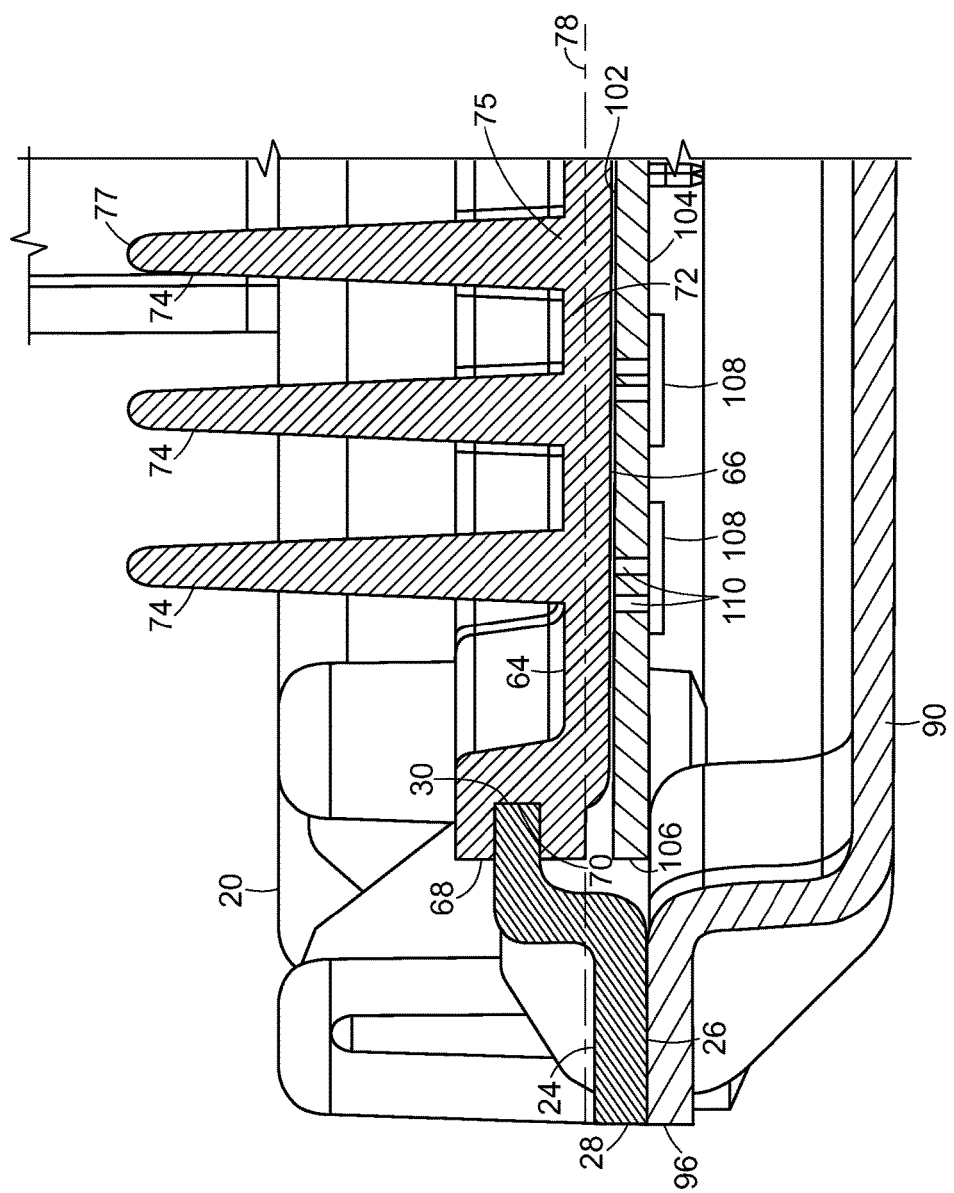
FIG. 5 is an enlarged view of the cross sectional view illustrated in FIG. 4.
Figure 6:
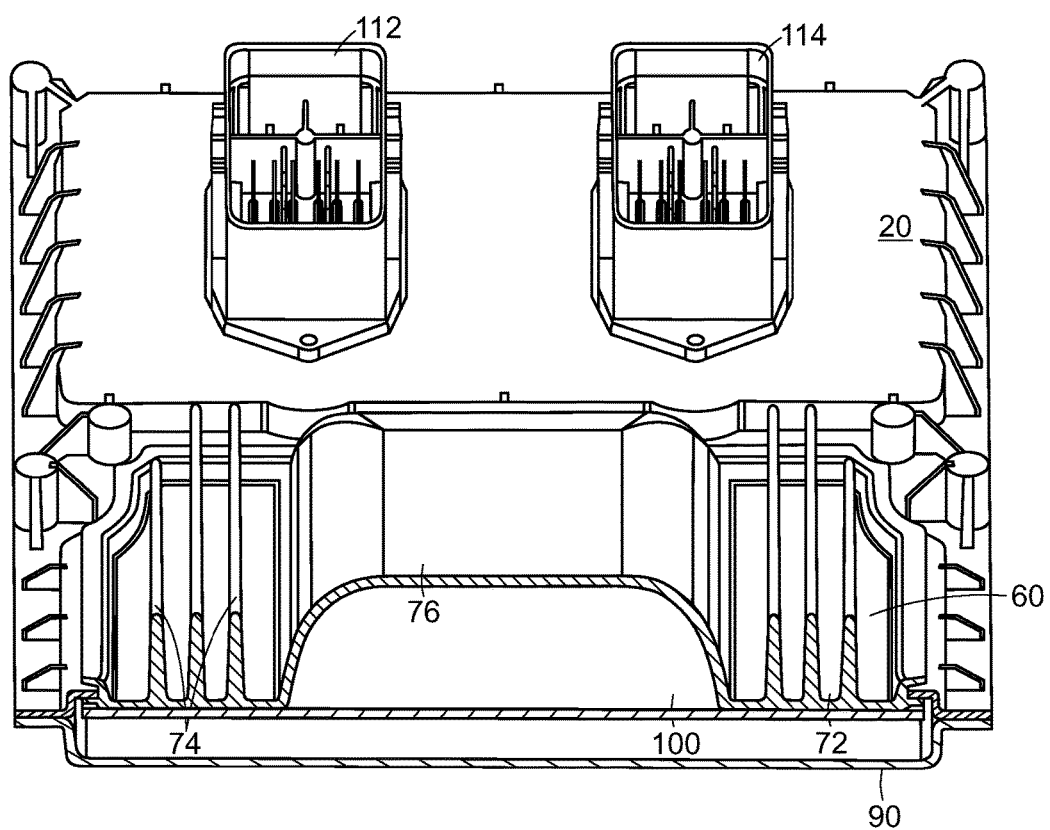
FIG. 6 is a perspective cross sectional view of housing assembly.

Referring to FIGS. 1-6, a housing assembly 10 for an electronic circuit including an ECU 120 is a low-profile, generally rectangular device. The housing assembly 10 includes a base 90, a cover 20 that closes an open end of the base 90, and a PCB 100. The PCB 100 is disposed between the base 90 and the cover 20 in such a way that the PCB 100 is fixed within the housing assembly 10. In the illustrated embodiment, the PCB 100 is used to support and provide electrical connections between connection plugs 112, 114, the ECU 120 and other electronic components 108 for controlling an external device, for example an internal combustion engine (not shown). The housing assembly 10 securely supports the PCB 100 and its associated electronic components 108 while providing improved cooling properties and lower manufacturing costs. This is achieved by providing passive cooling features on an outer surface of the cover 20, and by employing a thermally conductive plastic to form the passive cooling features, where the cover 20 has predetermined and defined anisotropic thermal conduction properties configured to optimize thermal conduction and cooling of the ECU, as discussed in detail below.

The base 90 of the housing assembly 10 is a flat, shallow container that includes a base surface 92 that is offset from, and parallel to, a rim 94. The rim 94 forms a rectangular border around the periphery of the base surface 92. The rim 94 includes through holes 98 that receive fasteners 99 therethrough. The fasteners 99 are used to secure the base 90 to the cover 20. The offset between the base surface 92 and the rim 94 is dimensioned to provide slight clearance to accommodate electronic components 108 disposed the PCB 100, for example the electronic components 108 mounted on a surface 104 of the PCB 100 that faces the base surface 92.

The PCB 100 is a rigid, multi-layer sheet of insulative material that includes electrically conductive tracks (not shown) used to electrically connect electronic components 108 to each other and/or to the connection plugs 112, 114. The connection plugs 112, 114 are disposed on a first side 102 of the PCB 100 at a location between a center of the PCB 100 and the peripheral edge 106 of the PCB 100. The connection plugs 112, 114 are of the type used to engage a wiring harness connector (not shown). The PCB 100 supports electronic components 108 such as the ECU 120, electrolytic capacitors, power components, etcetera, on both the first side 102 that faces the cover 20, and on the opposed, second side 104 that faces the base 90. In addition, the PCB 100 includes thermally conductive vias 110 that extend between the first and second sides 102, 104. In some embodiments, the vias 110 are dedicated to thermal conduction, while in other embodiments, the vias 110 function as both electrical and thermal conduction pathways. Within the housing assembly 10, the first side 102 of the PCB 100 abuts the cover 20 which includes cooling features, as discussed further below. Thus, cooling of the PCB and its associated electronics is achieved via thermal conduction and convection between the PCB 100 and the cover 20. In addition, the electronic components 108 supported on the second side 104 of the PCB 100 are cooled by way of the thermally conductive vias 110 that extend between the first side 102 and the second side 104 of the PCB 100.

The cover 20 of the housing assembly 10 is configured to close the open end of the base 90 and to provide passive cooling of the assembly. The cover 20 includes a frame portion 22 that is configured to engage the rim 94 of the base 90, and to cooperate with the base 90 to support the PCB 100. The cover 20 also includes a heat sink portion 60 that is surrounded by, and supported on, the frame portion 22.

The frame portion 22 is a rigid sheet having a peripheral shape and dimensions that correspond to the rectangular shape and dimensions of the base 90. The frame portion 22 includes plug openings 32, 34 disposed between a center 42 of the frame portion 22 and the peripheral edge 28 of the frame portion 22 along one side 28a of the frame portion 22. In addition, the frame portion 22 includes a heat sink opening 30 disposed along an opposed side 28b of the frame portion 22. The heat sink opening 30 is generally rectangular in shape and is surrounded by the peripheral edge 28. The heat sink opening 30 defines a relatively large opening area $A_1$ as compared to the total area of the frame portion $A_2$. For example, in some embodiments, the opening area $A_1$ is in a range of 30 percent to 70 percent of the total area $A_2$. In the illustrated embodiment, the the opening area $A_1$ is about 45 percent of the total area $A_2$, and overlies the center 42. The heat sink opening 30 is shaped and dimensioned to correspond to the shape and dimensions of the heat sink portion 60 as discussed further below.

An outward-facing surface 24 of the frame portion 22 includes outwardly-protruding stiffening ribs 36. Each stiffening rib 36 originates at a portion of the peripheral edge 28, and is is oriented so as to extend in a direction perpendicular to the portion of the peripheral edge 28. The outward-facing surface 24 of the frame portion 22 also includes outwardly-protruding bosses 38 that are disposed along the peripheral edge 28. The bosses 38 are configured to receive and engage with the fasteners 99. To that end, each boss 38 includes a blind, threaded internal opening 39 that opens at the inward-facing surface 26 of the frame portion 22.

The heat sink portion 60 provides cooling features that facilitate cooling of the housing assembly 10. The heat sink portion 60 is a rigid sheet that includes an outward-facing side 64, and an inward-facing side 66 that is opposed to the outward-facing side and abuts the PCB 100. A slot 70 is formed in the peripheral edge 68 of the heat sink portion 60. The slot 70 extends along the entire circumference of the heat sink portion 60, and is configured to receive a portion of the frame portion 22. Specifically, an inner edge of the frame portion 22 corresponding to the heat sink opening 30 is disposed within the slot 70, whereby the heat sink portion 60 is secured to the frame portion 22. This configuration is achieved by a two-component injection molding process in which the frame portion 22 and the heat sink portion 60 are made in-place together on the same injection molding tool.

The heat sink portion 60 includes a generally planar region 72 that defines a plane 78, and a domed region 76 in which the heat sink portion 60 protrudes outwardly relative to the plane 78. As a result, a depression is formed in the heat sink portion inward-facing side 66 at a location corresponding to the domed region 76. The domed region 76 is generally rectangular when viewed in plan view, and is positioned so as to overlie a portion of the PCB 100 that supports relatively large electronic components such as large elecrolytic capcitors, which in turn are positioned generally centrally on the first side 102 of the PCB 100. In addition, the domed region 76 is positioned along one side 68a of the heat sink portion 60. The planar region 72 surrounds three sides of the domed region 76.

The planar region 72 is formed having passive cooling features. The features include cooling ribs 74 that protrude outward from the outward-facing surface 64 of the heat sink portion 60. The cooling ribs 74 extend linearly between the domed region 76 and the peripheral edge 68 in a direction perpendicular to the one side 68a. The cooling ribs 74 each include a root portion 75 that is integrally joined to the planar region 72, and a rounded terminal end 77 that is spaced apart from the root portion 75. Each cooling rib 74 is slightly tapered such that the terminal end 77 has a width that is less than the width of the rib at the root portion 75. The shape and the height of the cooling ribs 74 (e.g., the distance between the terminal end 77 and the root portion 75) are optimized for efficiency and to avoid material waste. In the illustrated embodiment, the height of the cooling ribs 74 is less than the height of the domed region.

The frame portion 22 and the heat sink portion 60 are formed of different materials. In particular, the frame portion 22 is formed of a first material that is a relatively high strength plastic material. For example, the frame portion is formed of Ultradur® B4330 G6 HR (PBT-GF30) such as manufactured by BASF SE of Ludwidgshafen, Germany, or other similar plastic material. The heat sink portion 60 is formed of a thermally conductive plastic material having anisotropic thermal properties. For example, the second material is formed of Therma-Tech® TT3300-5001 EC Grey such as manufactured by Polyone Corporation of Avon Lake, Ohio, or other similar plastic material. In the illustrated embodiment, the heat sink portion 60 has anisotropic thermally conductive properties that have been configured, via a manufacturing method discussed below, to optimize thermal conduction through the heat sink portion 60 in desired, predetermined directions so as to optimize the thermal conductivity of the heat sink portion 60 and cooling of the housing assembly 10.

As a result, the heat sink portion 60 is configured to provide greater thermal conductivity in predetermined directions than in other directions.

In the illustrated embodiment, thermal conductivity of the planar region 72 is greater within the plane 78 defined by the planar region 72 than in directions perpendicular to the plane. In addition, within the cooling ribs 74, thermal conductivity is greater in directions parallel to the rib height direction than in directions perpendicular to rib hight direction.

In other words, the heat sink portion 60 is formed of the second material that is thermally anisotropic and is configured to provide a) within the planar region 72, a higher thermal conductivity in directions parallel to the plane 78 than in non parallel directions including directions perpendicular to the plane 78, and b) within the cooling ribs 74, a higher thermal conductivity in directions perpendicular to the plane 78 than in non-perpendicular directions including directions parallel to the plane 78.

A negative feature of thermally conductive plastic materials of the type used to form the heat sink portion 60 is that they are relatively brittle as compared to some other plastic materials. For this reason, the frame portion 22 is formed of the first material which has a higher strength than the second material, and has sufficiently high strength to ensure that the housing 10, including the cover 20, has sufficient structural integrity to support and protect the ECU 120 within an engine compartment of a vehicle. As a result, the advantages of using a light weight material such as plastic can be realized while providing a housing assembly 10 configured to safely and securly house the PCB 100 including the ECU 120. By forming the cover 20 as a subassembly that includes a plastic frame portion 22 having relatively high strength and a plastic heat sink portion 60 having optimized thermal conduction properties, a light weight, low cost housing assembly is provided.

Figure 7:
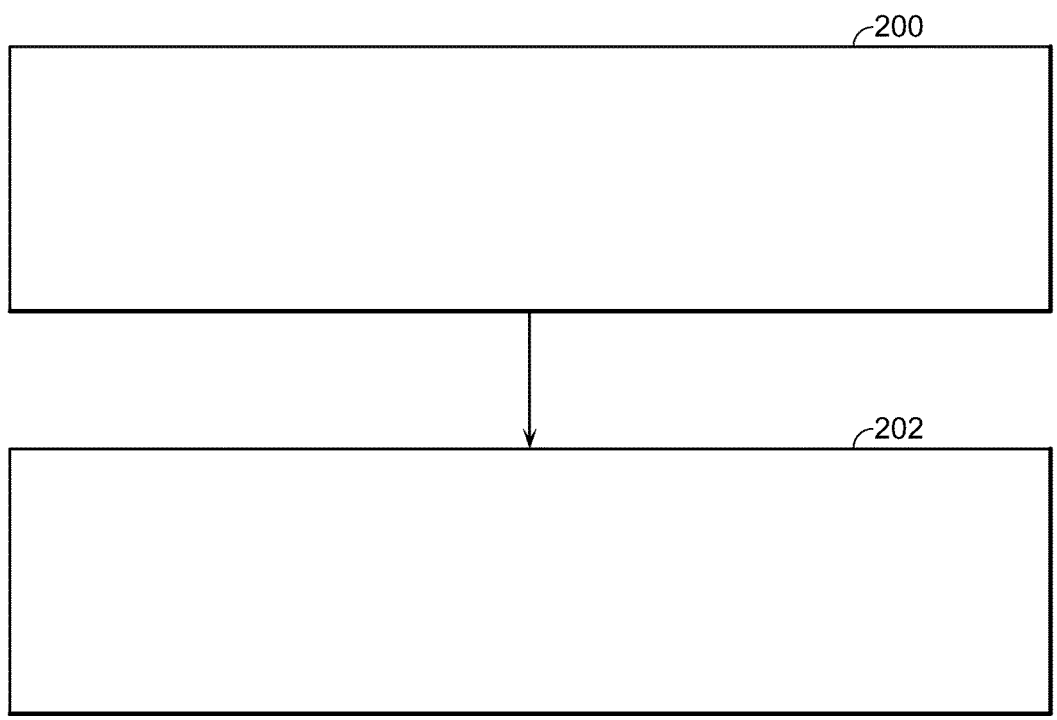
FIG. 7 is a flow chart of a method of manufacturing the housing assembly.

In addition, the housing assembly 10 securely supports the PCB 100 and its associated electronic components 108 while providing passive cooling features on an outer surface of the cover 20, where the cover 20 has predetermined and defined anisotropic thermal conduction properties configured to optimize thermal conduction and cooling of the ECU 120. For example, in the illustrated embodiment, the first side 102 of the PCB 100 abuts the heat sink portion 60 of the cover 20. Heat generated by the electronic components 108 supported on both sides 102, 104 of the PCB 100 is conducted to the heat sink portion 60, through the planar region 72 and to the cooling ribs 74, which provide a large surface area through which heat is transferred to the atmosphere Referring to FIG. 7, a method of manufacturing the cover 20 of the housing assembly 10 in such as way as to optimize the thermal conduction properties of the cover 20 will now be described. The method is based on a realization that the thermally conductive plastic material used to form the heat sink portion 60 can be provided with specific thermally anisotropic properties by controlling the injection molding process. The method takes advantage of the feature in which the thermal anisotropy within the material can be controlled and defined based on how the injection of the plastic is performed. In particular, by performing injection molding of the thermally conductive plastic material such that a filler within the thermally conductive plastic material is aligned with a predetermined direction, the thermal conductivity of the thermally conductive material is enhanced along the predetermined direction relative to other directions within the material.

As an initial step (step 200), a molding tool and injection configuration for an injecting molding process are provided. The molding tool and injectors of an injection molding device are arranged such that, during manufacture of the cover 20, injected material flows in a direction corresponding to a path of desired thermal conduction.

The path of desired thermal conduction within the cover 20 is determined by performing a thermal finite element analysis (FEA) of the cover 20 while taking into account the anisotropic properties of the thermally conductive plastic. The thermal FEA is used to identify an optimal thermal conductivity map that is optimized for cooling efficiency of the cover. In particular, the optimal thermal conductivity map provides paths of thermal conduction within the cover 20 that will optimize cooling of the cover 20.

The optimal thermal conductivity map is then used to determine an injection molding tool and injector arrangement within an injection molding device that injects plastic into the mold such a flow direction of the injected plastic is aligned with the paths of desired thermal conduction. This in turn has the effect that filler material within the thermally conductive plastic becomes aligned with the paths of desired thermal conduction. That is, the injectors and the tool cooperate to provide a flow of injected material in which the filler material is oriented and/or aligned in predetermined directions that correspond to the paths of desired thermal conductivity. By doing so, thermal conduction within the cover 20 resulting from the injection molding process is enhanced along the paths of desired thermal conduction relative to other directions.

In the cover 20, the paths of desired thermal conduction within the planar region 72 were determined to be within the plane 78, the path providing a higher thermal conductivity in the planar region 72 in directions parallel to the plane 78 than in non parallel directions including directions perpendicular to the plane 78. In addition, the paths of desired thermal conduction within the cooling ribs 74 were determined to be perpendicular to the plane 78 (e.g., parallel to a height direction of the cooling ribs), the path providing a higher thermal conductivity within the cooling ribs 74 in directions perpendicular to the plane 78.

In a subsequent step (step 202), injection molding of the cover 20 is performed using the tool and the injection configuration provided in step 201 to manufacture the component having anisotropic thermal conduction properties that provide greater thermal conductivity in the direction of desired thermal conduction relative to other directions. In some embodiments, the cover 20, which includes the frame portion 22 formed of the first plastic material and the heat sink portion 60 formed of the second plastic material, is fabricated using a two-component injection molding process in which the frame portion 22 and the heat sink portion 60 are made in-place together on the same injection molding tool.

Although the housing 10, including the base 90, the PCB 100 and the cover 20 are illustrated as having a rectangular shape when viewed in plan view, the base 90, the PCB 100 and the cover 20 are not limited to having a rectangular shape. For example, the base 90, the PCB 100 and the cover 20 may have another polygonal shape, an irregular shape including cut outs, or other shape as determined by the requirements of the application.

Figure 8:
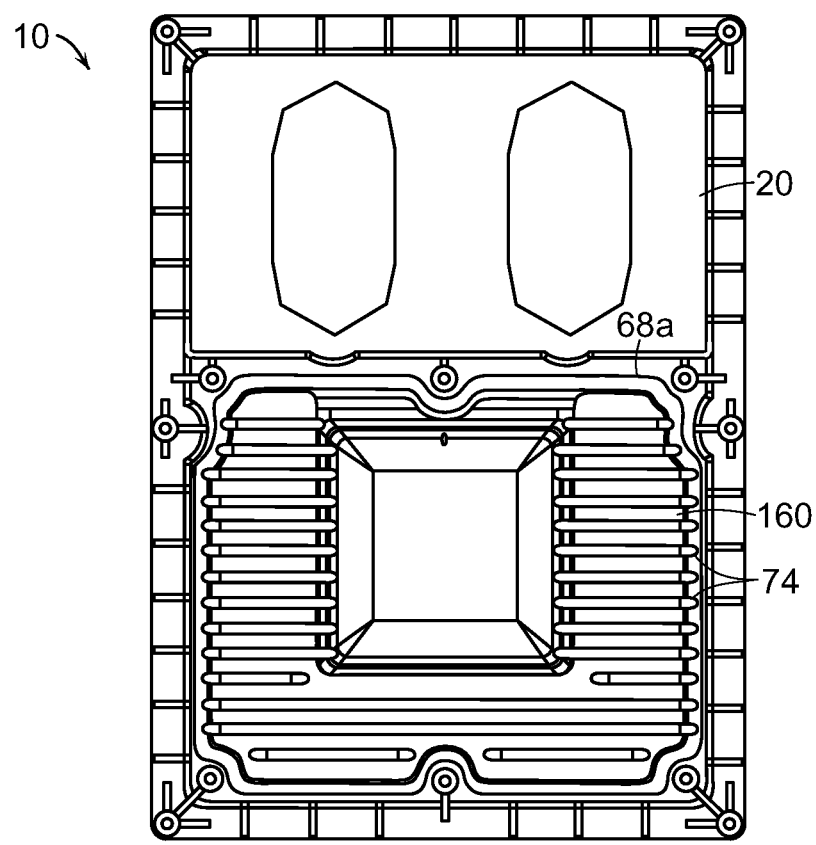
FIG. 8 is a top plan view of an alternative embodiment cover of the housing assembly.

In the embodiment illustrated in FIGS. 1-6, the cooling ribs 74 extend linearly between the domed region 76 and the peripheral edge 68 in a direction perpendicular to the first side edge 68a. However, the cooling ribs 74 are not limited to this configuration. For example, in an alternative embodiment heat sink portion 160, the cooling ribs 74 may extend in a direction parallel to the first side edge 68a (shown in FIG. 8), or at an acute angle relative to the first side edge 68a (not shown).

Selective illustrative embodiments of the system and device are described above in some detail. It should be understood that only structures considered necessary for clarifying the system and device have been described herein. Other conventional structures, and those of ancillary and auxiliary components of the system and device, are assumed to be known and understood by those skilled in the art. Moreover, while a working example of the system and device have been described above, the system and device are not limited to the working examples described above, but various design alterations may be carried out without departing from the system and device as set forth in the claims.

What is claimed, is:

1. A housing assembly for an electronic control unit, the housing assembly comprising:
   a printed circuit board having a first side, and a second side that is opposed to the first side, at least one of the first side and the second side supporting electrical components;
   a frame portion that is disposed on one side of the printed circuit board and supports the printed circuit board, and is a rigid sheet that is formed of a first material and has an inner edge that defines a heat sink opening, the heat sink opening extending through a thickness of the rigid sheet; and
   a heat sink portion that is a rigid sheet that is formed of a second material, the heat sink portion abutting the first side of the printed circuit board, the heat sink portion being disposed in the heat sink opening with a peripheral edge of the heat sink portion interlocked with the inner edge in such a way that the heat sink portion is supported by the frame portion,
   wherein the first material is different than the second material, and the second material is a thermally conductive plastic.

2. The housing assembly of claim 1 wherein the second material is thermally anisotropic and is configured to provide greater thermal conductivity in predetermined directions than in other directions.

3. The housing assembly of claim 1 wherein
   the heat sink portion includes a planar region defining a plane and having cooling ribs that protrude outwardly from one side of the planar region, and
   the second material is thermally anisotropic and is configured to provide within the planar region, a higher thermal conductivity in a direction parallel to the plane than in a direction perpendicular to the plane, and within the cooling ribs, a higher thermal conductivity in a direction perpendicular to the plane than in a direction parallel to the plane.

4. The housing assembly of claim 1, wherein the first material is a plastic material having a greater strength than the second material.

5. The housing assembly of claim 1, wherein the heat sink portion is surrounded by the frame portion.

6. The housing assembly of claim 1, wherein the heat sink portion comprises
an outward-facing side,
an inward-facing side that is opposed to the outward facing side and abuts the printed circuit board, and
cooling ribs that protrude outwardly from the outward-facing side.

7. The housing assembly of claim 6, wherein the heat sink portion comprises a domed region that protrudes outwardly from the outward-facing side, and the cooling ribs are disposed between the domed region and a peripheral edge of the heat sink portion.

8. The housing assembly of claim 7, wherein the printed circuit board supports electronic components on the first side, and the domed region overlies the electronic components.

9. The housing assembly of claim 1, wherein a slot is formed along a circumference of a peripheral edge of the heat sink portion, and the inner edge of the frame portion is received within the slot.

10. The housing assembly of claim 1, wherein the printed circuit board includes electronic components supported on the second side and thermally conductive vias that extend between the first side and the second side.

11. The housing assembly of claim 1, wherein the frame portion includes a peripheral edge, and the heat sink opening is surrounded by the peripheral edge.

12. The housing assembly of claim 11, wherein an outward-facing surface of the frame portion includes outwardly protruding stiffening ribs.

13. The housing assembly of claim 12, wherein each stiffening rib is includes one end that is disposed at a portion of the peripheral edge and an opposed end that is spaced apart from the portion of the peripheral edge, and each stiffening rib is oriented so as to extend in a direction perpendicular to the portion of the peripheral edge.

14. The housing assembly of claim 1, wherein the heat sink is formed via an injection molding process that provides the second material with anisotropic properties.

15. The housing assembly of claim 14, wherein
the heat sink portion includes a planar region defining a plane,
the heat sink portion includes cooling ribs that protrude outwardly front one side of the planar region, and
the second material is thermally anisotropic and is configured to provide
within the planar region, a higher thermal conductivity in a direction parallel to the plane than in a direction perpendicular to the plane, and
within the cooling ribs, a higher thermal conductivity in a direction perpendicular to the plane than in a direction parallel to the plane.

16. The housing assembly of claim 1, wherein the housing assembly is formed in a two-component injection molding process in which the frame portion and the heat sink portion are made in-place together.

17. The housing assembly of claim 1, comprising
a base; and
a cover that closes an open end of the base,
wherein the printed circuit board is disposed between the base and the cover, and the cover comprises the frame portion and the heat sink portion.

* * * * *